United States Patent
Kayama et al.

(10) Patent No.: US 6,771,978 B1
(45) Date of Patent: Aug. 3, 2004

(54) RADIO COMMUNICATION APPARATUS AND METHOD FOR CONTROLLING TRANSMISSION POWER

(75) Inventors: Hidenori Kayama, Yokosuka (JP); Katsuhiko Hiramatsu, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 509 days.

(21) Appl. No.: 09/889,963

(22) PCT Filed: Nov. 27, 2000

(86) PCT No.: PCT/JP00/08335

§ 371 (c)(1),
(2), (4) Date: Jul. 24, 2001

(87) PCT Pub. No.: WO01/39402

PCT Pub. Date: May 31, 2001

(30) Foreign Application Priority Data

Nov. 25, 1999 (JP) .......................... 11-333660

(51) Int. Cl.⁷ ................................. H04Q 7/20
(52) U.S. Cl. .................. 455/522; 455/67.13; 455/69
(58) Field of Search ............... 455/522, 67.13, 455/524, 69, 33.1, 54.1, 437, 67.1, 67.4; 370/335, 342, 537, 18

(56) References Cited

U.S. PATENT DOCUMENTS

| | | | |
|---|---|---|---|
| 5,267,262 A | * | 11/1993 | Wheatley, III .............. 455/522 |
| 5,960,353 A | * | 9/1999 | Lee ............................. 455/453 |
| 5,999,816 A | * | 12/1999 | Tiedemann, Jr. et al. ... 455/437 |
| 6,256,476 B1 | * | 7/2001 | Beamish et al. ........... 340/7.36 |
| 6,334,047 B1 | * | 12/2001 | Andersson et al. .......... 455/69 |
| 6,353,638 B1 | * | 3/2002 | Hottinen et al. ............. 375/260 |
| 6,393,257 B1 | * | 5/2002 | Holtzman ................. 455/67.13 |

FOREIGN PATENT DOCUMENTS

| | | |
|---|---|---|
| EP | 0853393 A1 | 7/1998 |
| EP | 1009098 A1 | 6/2000 |
| EP | 0982874 A2 | 9/2000 |
| JP | 11243363 | 9/1999 |
| JP | 2000 78029 | 3/2000 |
| JP | 2000 183758 | 6/2000 |
| WO | 9750197 | 12/1997 |

OTHER PUBLICATIONS

A. Shibutani, et al.; "Reducing average number of turbo decoding iterations", Electronics Letters, IEE Stevenage, GB, vol. 35, No. 9, Apr. 29, 1999, pp. 701–702, XP006012065, ISSN: 0013–5194.

(List continued on next page.)

*Primary Examiner*—Nay Maung
*Assistant Examiner*—Tan Trinh
(74) *Attorney, Agent, or Firm*—Stevens, Davis, Miller & Mosher, LLP (57) ABSTRACT

Turbo decoding section 102 performs turbo decoding on demodulated data, counting section 103 counts the number of iterations in turbo decoding, CRC decision section 104 performs CRC on the decoded data, increment/decrement value calculating section 105 calculates an increment or decrement value in reference SIR according to the presence or absence of an error and the number of iterations, reference SIR updating section 106 adds the increment or decrement value in reference SIR and a current reference SIR value to obtain a new reference SIR value, comparing section 108 compares an SIR value of a received signal measured in SIR measuring section 107 with the updated reference SIR value, and transmit power control bit generating section 109 generates a transmit power control bit according to the compared result.

6 Claims, 5 Drawing Sheets

OTHER PUBLICATIONS

R. Y. Shao, et al.; "Two Simple Stopping Criteria for Iterative Decoding", Proceedings of the 1998 IEEE International Symposium on Information Theory, ISIT 1998, Cambridge, MA, Aug. 16–21, 1998, p. 279, XP002135987, ISBN: 0–7803–5001–4.

Electronics Letters, IEE, vol. 35, No. 9, Apr. 29, 1999; H. Kawai, H. Suda, F. Adachi "Outer–loop control of target SIR for fast transmit power control in turbo–coded W–CDMA mobile radio" pp. 699–701.

* cited by examiner

RADIO COMMUNICATION APPARATUS AND METHOD FOR CONTROLLING TRANSMISSION POWER

TECHNICAL FIELD

The present invention relates to a radio communication apparatus and transmit power control method.

BACKGROUND ART

In a CDMA (Code Division Multiple Access) mobile communication system, transmit power control is an important technique in increasing a system capacity. One of transmit power control methods is an outer loop transmit power control method. In the outer loop transmit power control method, in order to hold the received channel quality (hereinafter abbreviated as "quality") such as FER (Frame Error Rate) at a constant level, a mobile station apparatus and base station apparatus vary a reference SIR (Signal to Noise Ratio) corresponding to the quality varying with the propagation environment, and according to a compared result between the variable reference SIR and received SIR, perform the transmit power control. In addition, the reason why the mobile station apparatus and base station apparatus vary the reference SIR so as to hold the quality at a constant level is because transmission With excessive quality increases interference to other stations, and therefore it is necessary to transmit signals with minimum transmit power meeting a required quality.

Figure 1:
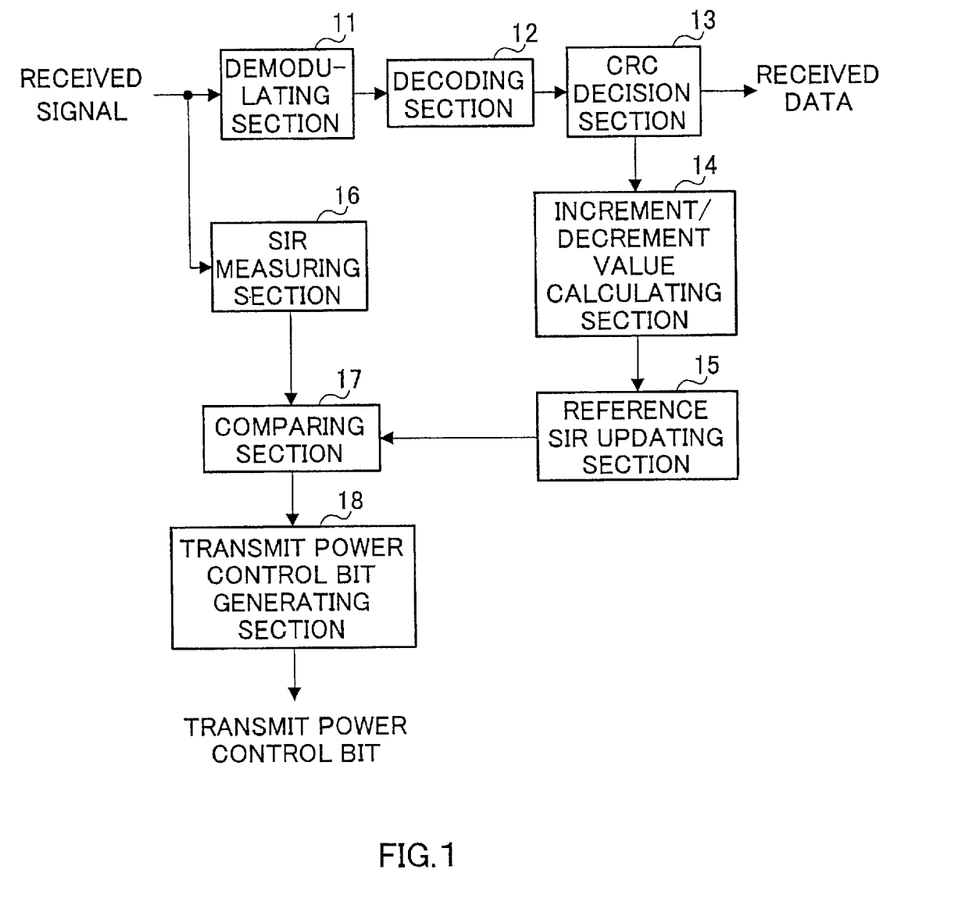
FIG. 1 is a principal block diagram illustrating a schematic configuration of a receiving system of a conventional radio communication apparatus.

A conventional radio communication apparatus that performs the outer loop transmit power control will be described below. FIG. 1 is a principal block diagram illustrating a schematic configuration of a receiving system in the conventional radio communication apparatus. In FIG. 1, demodulating section 11 performs the predetermined demodulation processing on a received signal. Decoding section 12 decodes the demodulated data. As a decoding method, soft-decision Viterbi decoding is used for speech communications, while turbo decoding is used for data communications.

CRC decision section 13 performs CRC (Cyclic Redundancy Check) on the decoded data, decides whether or not data has an error, and outputs the decided received data. When an error is detected (when CRC is not good: CRC=NG), increment/decrement value calculating section 14 generates an increment value S1 in reference SIR expressed by the following equation (1). When an error is not detected (when CRC is good: CRC=OK), increment/decrement value calculating section 14 generates a decrement value S2 in reference SIR expressed by the following equation (2).

$$S1 = 0.5 [dB] \quad (1)$$

$$S2 = -S1 * FER\_TARGET/(1-FER\_TARGET)[dB] \quad (2)$$

FER_TARGET=$10^{-3}$ (Speech communications)

FER_TARGET=$10^{-4}$ (Data communications)

The following equations (1) and (2) are such equations that are generally used as equations for calculating an increment or decrement value in reference SIR in the outer loop transmit power control. In addition, FER_TARGET is indicative of a frame error rate (quality) which the radio communication apparatus holds as a constant level.

Reference SIR updating section 15 adds an increment or decrement value in reference SIR determined by the above equation (1) or (2) and a current reference SIR value to update the reference SIR value. Generally, an update interval is 10 ms. The updated reference SIR value is output to comparing section 17.

Comparing section 17 compares an SIR value of a received signal measured in SIR measuring section 16 with the updated reference SIR value, and outputs the compared result to transmit power control bit generating section 18. When the measured SIR value is more than the reference SIR value, transmit power control bit generating section 18 generates a transmit power control bit for instructing a communication partner to decrease the transmit power. Meanwhile, when the measured SIR value is equal to or less than the reference SIR value, transmit power control bit generating section 18 generates a transmit power control bit for instructing a communication partner to increase the transmit power.

Transmit power control bit generating section 18 outputs the generated transmit power control bit to a transmitting system of the radio communication apparatus. In the transmitting system, the transmit power control bit is mapped in a transmission signal. The commination partner adjusts the transmit power according to the received transmit power control bit. The conventional radio communication apparatuses thus perform the outer loop transmit power control there between.

However, there are problems with the conventional radio communication apparatus and outer loop transmit power control method, as follows.

In turbo decoding used in data communications, decoding reliability on a decoded bit is added to a data sequence decoded by Soft Output Viterbi algorithm (SOVA) or Maximum A-Posteriori Probability algorithm (MAP). The data sequence added the decoding reliability undergoes iterated decoding, thereby increasing the decoding accuracy. In addition, the number of times the iterated decoding is performed in turbo decoding is called the number of iterations. The number of iterations is generally set to "8".

In the conventional radio communication apparatus, turbo decoding is repeatedly performed always until the number of iterations reaches "8". Then, according to the CRC decision result on the decoded data processed for the eighth iteration, the increment or decrement value in reference SIR is calculated. Accordingly, transmit power such that an error is not detected at the eighth iteration for the first time is optimal transmit power to increase the system capacity. In other words, transmit data with an excessive quality transmitted with excessive transmit power such that an error is not detected at the seventh or less iteration for the first time increases the interference to other stations, and thereby decreases the system capacity.

Even when the conventional radio communication apparatus receives data (data with an excessive quality) such that an error is not detected, for example, at the fourth iteration, the apparatus fixedly calculates the decrement value S2 in reference SIR, in the same way as the case of receiving data (data with an optimal quality) such that an error is not detected at the eighth iteration, according to the above equation (2). Specifically, the decrement value S2 in reference SIR is as follows:

$$S2 = -0.5 * 10^{-4}/(1-10^{-4}) \approx -0.5/10000 [dB] \quad (3)$$

In addition, the calculation obtains FER_TARGET=$10^{-4}$ (for data communications). It is understood from the equation that the reference SIR value decreases by an extremely gentle gradient not depending on the quality of received data.

Accordingly, in the conventional radio communication apparatus, when the quality of received data is once excessive, an extremely long time is required for the reference SIR value to be set to an optimal reference SIR value. In other words, in the conventional radio communication apparatus, a period of time data is transmitted with excessive transmit power is extremely long, thereby increasing the interference to other stations and decreasing the system capacity.

DISCLOSURE OF INVENTION

It is an object of the present invention to provide a radio communication apparatus and transmit power control method capable of preventing the decrease in a system capacity caused by excessive transmit power.

The inventors of the present invention focused on the relationship between a received channel quality and the number of times turbo decoding is iterated (the number of iterations), found out that a condition of the received channel quality is determined by the number of iterations, and carried out the present invention.

In order to achieve the above object, in the present invention, an increment or decrement width in a reference SIR value is varied adaptively corresponding to the number of iterations performed until a data error is not detected, whereby a period of time the reference SIR value is set to an optimal reference SIR value is shortened.

BEST MODE FOR CARRYING OUT THE INVENTION

Figure 2:
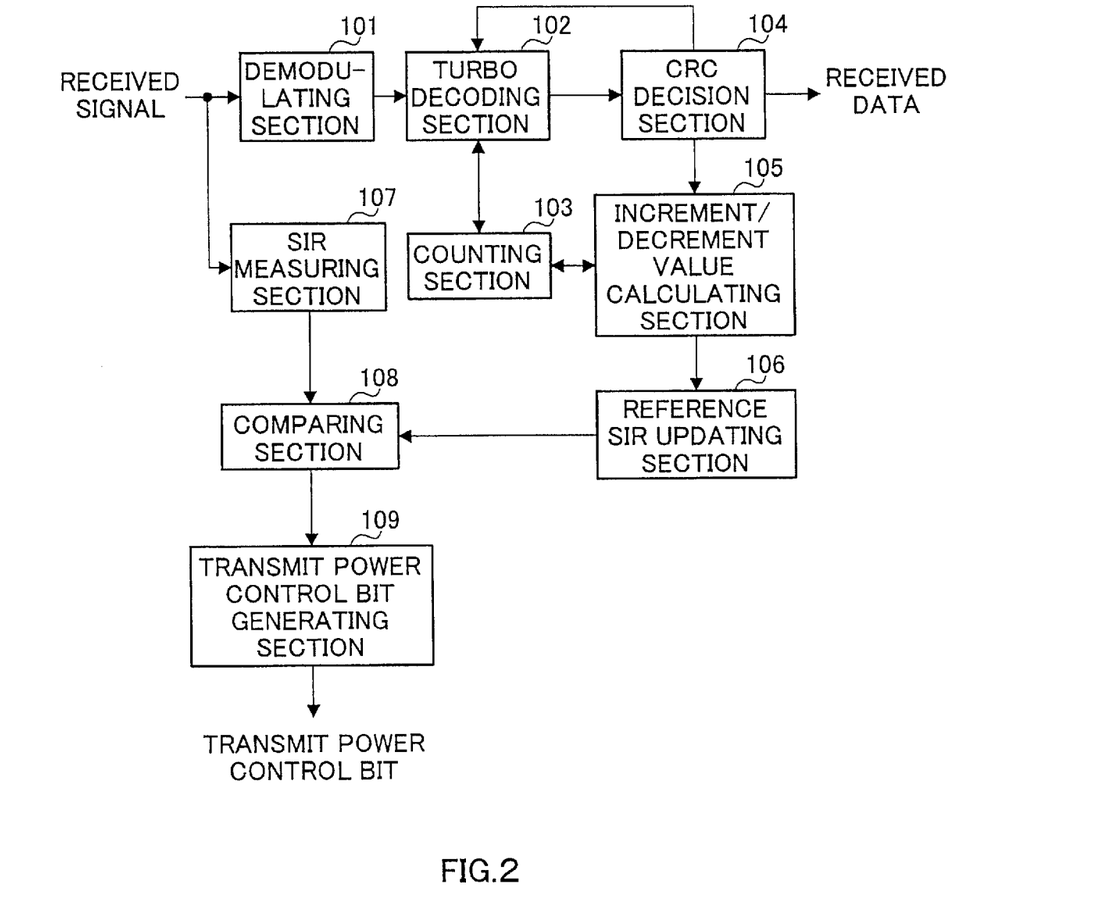
FIG. 2 is a principal block diagram illustrating a schematic configuration of a receiving system of a radio communication apparatus according one embodiment of the present invention.

An embodiment of the present inventing will be described below with reference to accompanying drawings. FIG. 2 is a principal block diagram illustrating a schematic configuration of a receiving system of a radio communication apparatus according one embodiment of the present invention.

In FIG. 2, demodulating section 101 performs the predetermined demodulation processing on a received signal. Turbo decoding section 102 performs turbo decoding on the demodulated data. Turbo decoding section 102 performs turbo decoding until data is not erroneous according to a decision result in CRC decision section 104 described later, or up to predetermined maximum iterations according to a counted result in counting section 103 described later.

Counting section 103 is set for the number of predetermined maximum iterations in advance. In addition, the number of maximum iterations is generally set at "8". Counting section 103 is to count the number of iterations in turbo decoding.

CRC decision section 104 performs CRC on the decoded data, decides whether or not data has an error, and outputs the decided received data. Increment/decrement value calculating section 105 calculates an increment or decrement value in reference SIR according to the number of iterations performed in turbo decoding section 102.

Reference SIR updating section 106 holds a current reference SIR value. SIR value updating section 106 adds the increment or decrement value in reference SIR determined in increment/decrement value calculating section 105 and the current reference SIR value to obtain a new reference SIR value. Then, reference SIR value updating section 106 updates the current reference SIR value according to the new reference SIR value, and outputs the updated reference SIR value to comparing section 108.

Comparing section 108 compares an SIR value of a received signal measured in SIR measuring section 107 with the updated reference SIR value, and outputs the compared result to transmit power control bit generating section 109. When the measured SIR value is more than the reference SIR value, transmit power control bit generating section 109 generates a transmit power control bit for instructing a communication partner to decrease the transmit power. Meanwhile, when the measured SIR value is equal to or less than the reference SIR value, transmit power control bit generating section 109 generates a transmit power control bit for instructing a communication partner to increase the transmit power.

Transmit power control bit generating section 109 outputs the generated transmit power control bit to a transmitting system of the radio communication apparatus. In the transmitting system, the transmit power control bit is mapped in a transmission signal. The commination partner adjusts the transmit power according to the received transmit power control bit. Radio communication apparatuses thus perform the outer loop transmit power control there between.

Figure 3:
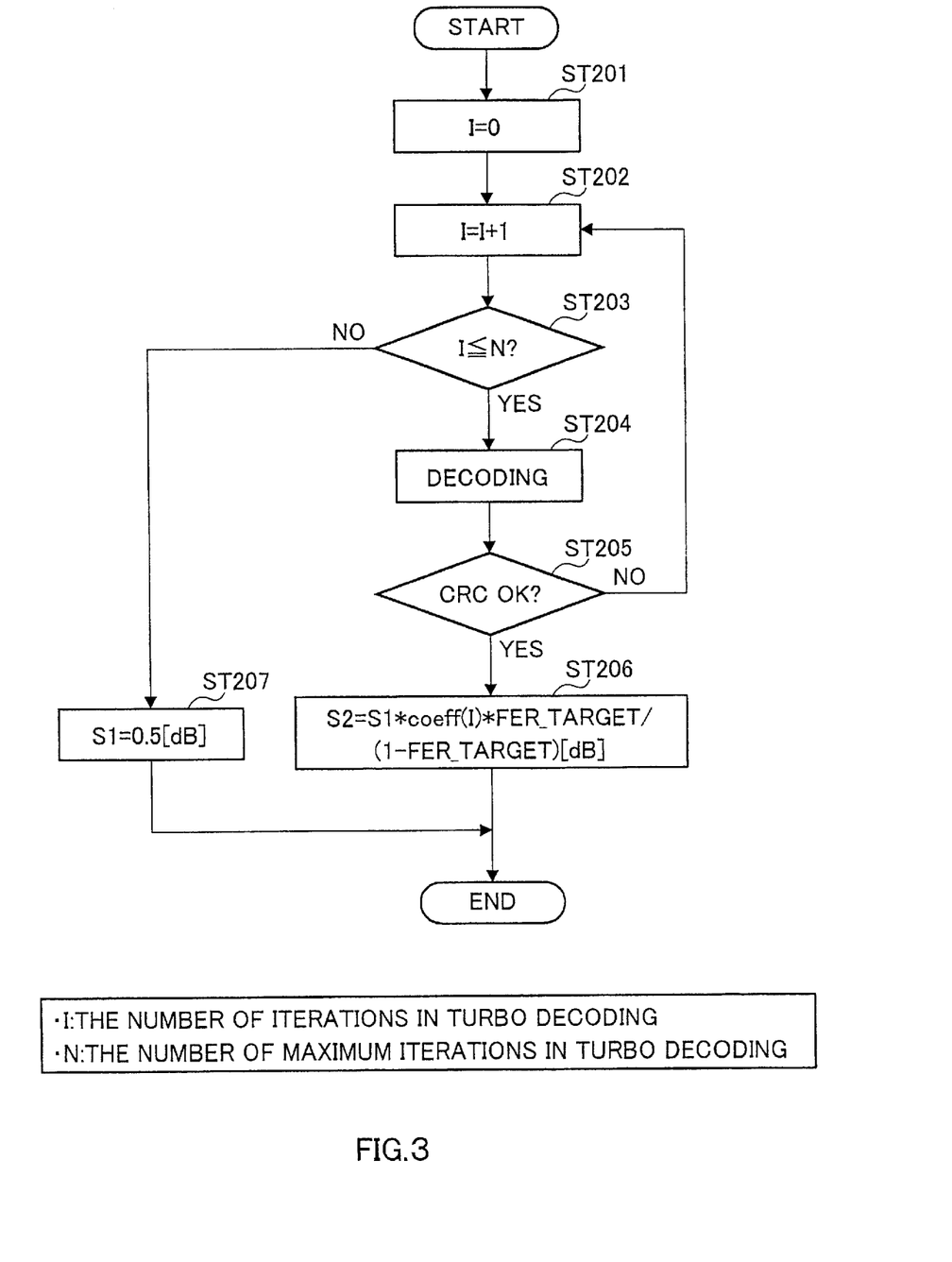
FIG. 3 is a flow diagram to explain the operation of the receiving system of the radio communication apparatus of one embodiment of the present invention.

The operation of the receiving system of the radio communication apparatus with the above configuration will be next described with reference to FIG. 3. FIG. 3 is a flow diagram to explain the operation of the receiving system of the radio communication apparatus of one embodiment of the present invention.

When demodulated data is output from demodulating section 101, first in step (hereinafter abbreviated as "ST") 201, turbo decoding 102 resets the number of iterations (I) held in counting section 103 to "0". In addition, in the flow diagram of FIG. 3, it is assumed that the number of iterations is indicated by "I", the number of predetermined maximum iterations for which the counting section 103 is set is indicated by "N", and that the number of predetermined maximum iterations is set at "8".

In ST202, turbo decoding section 102 increments the number of iterations (I) held in counting section 103 by 1.

In ST203, counting section 103 compares the number of iterations (I) with the number of maximum iterations (N). When "I" is equal to or less than "N" (I≦N), counting section 103 instructs turbo decoding section 102 to perform first decoding. In this case, the processing flow proceeds to ST204.

In ST204, turbo decoding section 102 performs first decoding on received data, and outputs the decoded data to CRC decision section 104.

In ST205, CRC decision section 104 performs CRC on the decoded data, and decides whether or not data has an error. When data has an error (when CRC is not good: CRC=NG), CRC decision section 104 outputs a signal indicative of that an error is detected to turbo decoding section 102. In this case, the processing flow returns to ST202, and the processing of ST202 to ST205 is repeated. In other words, such processing is performed eight times or less until CRC decision section 104 does not detect an error on the second or more decoding result obtained in turbo decoding section 102.

In ST205, when an error is not detected (when CRC is good: CRC=OK), CRC decision section 104 outputs a signal indicative of that an error is not detected to turbo decoding section 102 and increment/decrement value calculating section 105. At this point, turbo decoding section 102 finishes the decoding processing.

In ST206, increment/decrement value calculating section 105 refers to the number of iterations (I) held in counting section 103. Then, increment/decrement value calculating section 105 generates a decrement value S2 in reference SIR according to the following equations (4) and (5), and outputs the generated decrement value S2 in reference SIR to reference SIR updating section 106.

$$S1=0.5[dB] \quad (4)$$

$$S2=-S1*coeff(I)*FER\_TARGET/(1-FER\_TARGET)[dB] \quad (5)$$

In the above equation (5), an coeff(I) is such a coefficient that is equal to more than 1 being inversely proportional to the number of iterations (I). FER_TARGET is indicative of a frame error rate (quality) which the radio communication apparatus holds as a constant level. Generally, FER_TARGET is set at $10^{-3}$ in the case of speech communications, while being set at $10^{-4}$ in the case of data communications. In other words, the above equation (5) is obtained by multiplying the conventional equation (2) for calculating a decrement value in reference SIR by the coeff (I).

Namely, the above equation (5) is indicative of that the decrement value in reference SIR is made larger as the number of iterations (I) is smaller. In other words, as the quality of received data is more excellent, the decrement value in reference SIR is made larger. Accordingly, when the quality of received data is once excessive, the decrement value in reference SIR is made larger in proportion to an excessive level, whereby a period of time the reference SIR value is set to an optimal reference SIR value is greatly reduced as compared to the conventional radio communication apparatus.

Meanwhile, in ST203, when "I" is not equal to or less than "N" (I>N), in other words, when the number of iterations (I) exceeds the number of maximum iterations (N), counting section 103 instructs turbo decoding section 102 to finish the decoding processing. Turbo decoding section 102 thus finishes the decoding processing. Meanwhile, counting section 103 outputs a signal indicative of that "I" exceeds "N" to increment/decrement value calculating section 105. According to the signal, in ST207, increment/decrement value calculating section 105 generates an increment value S1 in reference SIR according to the above equation (4), and outputs the generated increment value in reference SIR to reference SIR updating section 106. Namely, when the quality of received data is poor and a CRC result is still erroneous after turbo decoding is performed repeatedly eight times on the received data, the reference SIR value is increased by 0.5 [dB].

In addition, the above equations (4) and (5) used in this embodiment are examples, and the present invention is not limited thereto. Accordingly, the above equation (4) is capable of being replaced with any equation expressing an increment value in reference SIR. Further, the above equation (5) is capable of being replaced with any equation expressing that an decrement value in reference SIR is made larger as the number of iterations (I) is smaller.

Figure 4:
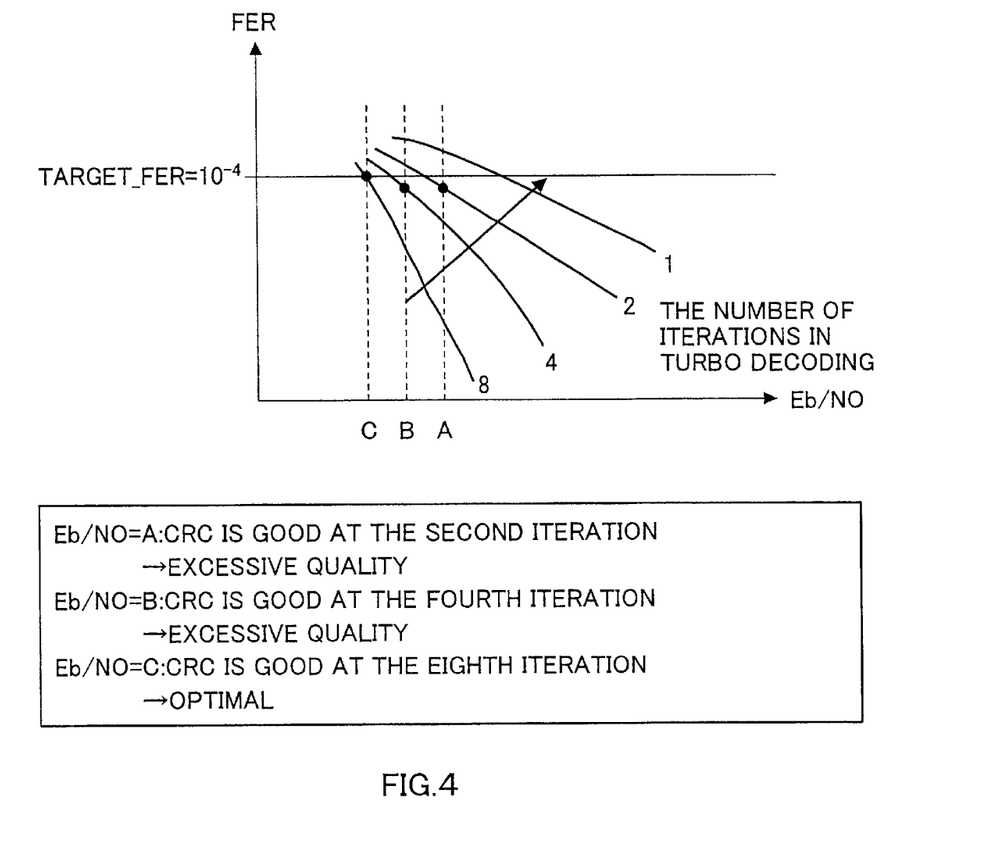
FIG. 4 is a graph to explain FER characteristics in turbo decoding.
Figure 5:
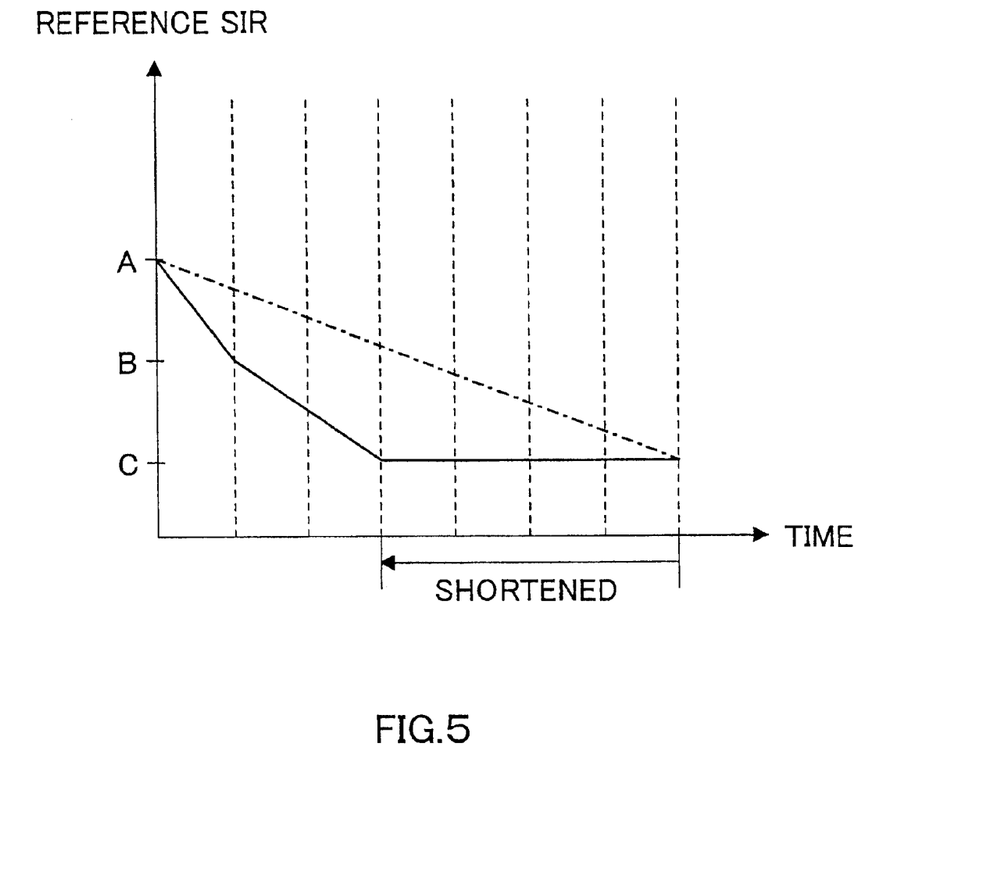
FIG. 5 is a graph indicating a variation in reference SIR when the outer loop transmit power control is performed using the radio communication apparatus of one embodiment of the present invention.

With reference to FIGS. 4 and 5, the variation in reference SIR will be described that is obtained when the outer loop transmit power control is performed using the radio communication apparatus with the above configuration. FIG. 4 is a graph to explain FER characteristics in turbo decoding. FIG. 5 is a graph indicating the variation in reference SIR when the outer loop transmit power control is performed using the radio communication apparatus according to one embodiment of the present invention.

The FER characteristics in turbo decoding will be first described using FIG. 4. In FIG. 4, the abscissa represents Eb/NO (ratio of received energy per user information bit to a noise density) and the ordinate represents FER. In this graph, FER characteristics of one iteration, two iterations, four iterations, and eight iterations in turbo decoding are indicated.

When FER_TARGET is set to $10^{-4}$, an error is not detected at the second iteration (CRC becomes good: CRC=OK) in the case of Eb/NO=A, and therefore the received data is in an excessive-quality condition. Further, also in the case of Eb/NO=B, since an error is not detected at the fourth iteration (CRC becomes good: CRC=OK), the received data is in an excessive-quality condition.

In the case of Eb/NO=C, since an error is not detected at the eighth iteration for the first time (CRC becomes good: CRC=OK), an optimal condition is provided that data is transmitted with minimum transmit power required for the communication. In addition, a value of Eb/NO changes sequentially with transmit power control.

With reference to FIG. 5, the variation in reference SIR will be described that is obtained when the outer loop transmit power control is performed using the radio communication apparatus with the above configuration. In FIG. 5, the abscissa represents time and the ordinate represents reference SIR value. Further, the solid line indicates the variation in reference SIR when the outer loop transmit power control is performed using the radio communication apparatus according to this embodiment, and the dot-dash line indicates the variation in reference SIR when the outer loop transmit power control is performed using the conventional radio communication apparatus.

When the outer loop transmit power control is performed using the conventional radio communication apparatus, as illustrated in FIG. 5, in both cases of Eb/NO=A and Eb/NO=b, the reference SIR value always decreases by an extremely gentle constant gradient, and reaches an optimal reference SIR value corresponding to the case of Eb/NO=C.

Meanwhile, when the outer loop transmit power control is performed using the radio communication apparatus according to this embodiment, since the decrement value in reference SIR is calculated according to the above equation (5), the reference SIR value decreases by an increasing gradient as the number of iterations is smaller. For example, it is assumed that such a coeff (I) is used that is "4" in the case of Eb/NO=A where an error is not detected at the second iteration (CRC becomes good: CRC=OK), while being "2" in the case of Eb/NO=B where an error is not detected at the fourth iteration (CRC becomes good: CRC=OK). When such a coeff(I) is used, as illustrated in FIG. 5, the reference SIR value decreases by a gradient four times that in the conventional apparatus in the case of Eb/NO=A, decreases by a gradient two times that in the conventional apparatus in the case of Eb/NO=B, and reaches an optimal reference SIR value corresponding to the case of Eb/NO=C.

Accordingly, when the outer loop transmit power control is performed using the radio communication apparatus according to this embodiment, as illustrated in FIG. 5, a period of time the reference SIR value reaches an optimal reference SIR is greatly shortened, as compared to the case that the outer loop transmit power control is performed using the conventional radio communication apparatus.

In addition, in the above embodiment, an SIR value is used as a reference value and measured value, however, the present invention is not limited thereto. In other words, it may be possible to use, as a reference value and measured value, a received level or any value capable of indicating a received quality.

Thus, according to this embodiment, a decrement width in reference SIR value is changed adaptively corresponding to the number of iterations performed until a data error is not detected, whereby it is possible to shorten a period of time a reference SIR value is set to an optimal reference SIR value. Accordingly, it is possible to reduce a period of time data is transmitted with excessive transmit power.

In addition, the radio communication apparatus according to the above embodiment is capable of being applied to a communication terminal apparatus and base station apparatus in a mobile communication system. When the radio communication apparatus is applied thereto, it is possible to shorten a period of time data is transmitted with excessive transmit power in the communication terminal apparatus and base station apparatus, whereby it is possible to prevent the decrease in a system capacity in the mobile communication system.

As described above, according to the present invention, it is possible to prevent the decrease in a system capacity caused by excessive transmit power.

This application is based on the Japanese Patent Application No.HEI11-333660 filed on Nov. 25, 1999, entire content of which is expressly incorporated by reference herein.

What is claimed is:

1. A radio communication apparatus comprising:
   a decoder that performs iterated decoding processing on received data;
   a decider that decides whether or not decoded data has an error whenever the decoding processing is performed;
   a counter that counts the number of processing times the iterated decoding processing is performed;
   an updator that updates a reference value of a value indicative of a received quality corresponding to the number of processing times; and
   a generator that generates a transmit power control bit according to a result obtained by comparing the updated reference value with a measured value of the value indicative of a received quality,
wherein said decoder performs the decoding processing until the error is not detected.

2. The radio communication apparatus according to claim 1, wherein said updator increases a decrement width in the reference value as the number of processing times is smaller.

3. A communication terminal apparatus mounted with a radio communication apparatus, said radio communication apparatus comprising:
   a decoder that performs iterated decoding processing on received data;
   a decider that decides whether or not decoded data has an error whenever the decoding processing is performed;
   a counter that counts the number of processing times the iterated decoding processing is performed;
   an updator that updates a reference value of a value indicative of a received quality corresponding to the number of processing times; and
   a generator that generates a transmit power control bit according to a result obtained by comparing the updated reference value with a measured value of the value indicative of a received quality,
wherein said decoder performs the decoding processing until an error is not detected.

4. A base station apparatus mounted with a radio communication apparatus, said radio communication apparatus comprising:
   a decoder that performs iterated decoding processing on received data;
   a decider that decides whether or not decoded data has an error whenever the decoding processing is performed;
   a counter that counts the number of processing times the iterated decoding processing is performed;
   an updator that updates a reference value of a value indicative of a received quality corresponding to the number of processing times; and
   a generator that generates a transmit power control bit according to a result obtained by comparing the updated reference value with a measured value of the value indicative of a received quality,
wherein said decoder performs the decoding processing until an error is not detected.

5. A transmit power control method, comprising:
   performing iterated decoding processing on received data until an error is not detected;
   updating a reference value of a value indicative of a received quality corresponding to the number of times the iterated decoding processing is performed; and
   generating a transmit power control bit according to a result obtained by comparing the updated reference value with a measured value of the value indicative of a received quality.

6. The transmit power control method according to claim 5, wherein a decrement width in the reference value is increased as the number of times the iterated decoding processing is performed is smaller.

* * * * *